(12) United States Patent
Majidzadeh Bafar et al.

(10) Patent No.: US 9,203,422 B2
(45) Date of Patent: Dec. 1, 2015

(54) LOW DISTORTION SWITCHED-CAPACITOR EVENT-DRIVEN ANALOG TO DIGITAL CONVERTER

(71) Applicant: ECOLE POLYTECHNIQUE FEDERALE DE LAUSANNE (EPFL), Lausanne (CH)

(72) Inventors: Vahid Majidzadeh Bafar, Lausanne (CH); Alexandre Schmid, Sion (CH); Yusuf Leblebici, Lutry (CH)

(73) Assignee: ECOLE POLYTECHIQUE FEDERALE DE LAUSANNE (EPFL), Lausanne (CH)

( * ) Notice: Subject to any disclaimer, the term of this patent is extended or adjusted under 35 U.S.C. 154(b) by 152 days.

(21) Appl. No.: 13/630,976

(22) Filed: Sep. 28, 2012

(65) Prior Publication Data

US 2013/0083951 A1    Apr. 4, 2013

Related U.S. Application Data

(60) Provisional application No. 61/540,569, filed on Sep. 29, 2011.

(51) Int. Cl.
*H04R 25/00* (2006.01)
*H03M 1/12* (2006.01)
*H03M 1/48* (2006.01)

(52) U.S. Cl.
CPC .............. *H03M 1/125* (2013.01); *H04R 25/453* (2013.01); *H04R 25/505* (2013.01); *H03M 1/48* (2013.01); *H04R 25/00* (2013.01); *H04R 2225/43* (2013.01)

(58) Field of Classification Search
CPC ............ H04R 3/02; H04R 3/04; H04R 25/00; H04R 25/353; H04R 25/45; H04R 25/453; H04R 25/505; H04R 2225/43; H03M 1/12; H03M 1/125; H03M 1/46; H03M 1/48
USPC ......... 381/312, 315, 317, 318, 320, 321, 120, 381/121, 316; 341/143, 150, 155
See application file for complete search history.

(56) References Cited

U.S. PATENT DOCUMENTS 5,111,419 A * 5/1992 Morley et al. ................. 708/322
6,020,840 A * 2/2000 Ong .............................. 341/155

(Continued)

FOREIGN PATENT DOCUMENTS

EP       2298164        3/2011
WO    WO 2005/004373    1/2005

(Continued)

OTHER PUBLICATIONS

Kurchuk, et al., "Signal-Dependent Variable-Resolution Clockless A/D Conversion with Application to Continuous-Time Digital Signal Processing," IEEE Transactions on Circuits and Systems—I: Regular Papers, 2010, vol. 57, No. 5, pp. 982-991.

(Continued)

*Primary Examiner* — Huyen D Le
(74) *Attorney, Agent, or Firm* — Sheridan Ross P.C.

(57) ABSTRACT

An event-driven tracking analog to digital converter (ADC) architecture is proposed. The proposed architecture has less sensitivity to amplifier and DAC non-linearity, reduces the swing and dynamic common-mode range requirement of the operational transconductance amplifier (OTA) and comparators, respectively.

8 Claims, 7 Drawing Sheets

(56) References Cited

U.S. PATENT DOCUMENTS

Figure 1:
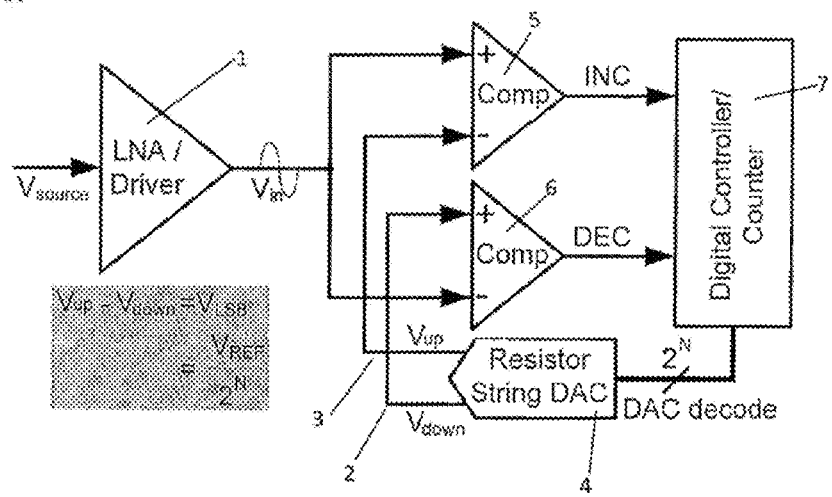

| | | |
|---|---|---|
| 7,839,317 B1 | 11/2010 | Sauer |
| 2004/0263375 A1 | 12/2004 | Tsividis |
| 2007/0216466 A1 | 9/2007 | Tsividis |
| 2008/0252280 A1 | 10/2008 | Prodic et al. |
| 2010/0270989 A1 | 10/2010 | Sasaki et al. |

FOREIGN PATENT DOCUMENTS

| | | |
|---|---|---|
| WO | WO 2006/039510 | 4/2006 |
| WO | WO 2006/063192 | 6/2006 |
| WO | WO 2007/036922 | 4/2007 |
| WO | WO 2011/046928 | 4/2011 |

OTHER PUBLICATIONS

Schell, et al., "A Continuous-Time ADC/DSP/DAC System With No Clock and With Activity-Dependent Power Dissipation," IEEE Journal of Solid-State Circuits, 2008, vol. 43, No. 11, pp. 2472-2481.

Silva, et al., "Wideband low-distortion delta-sigma ADC topology," Electronics Letters, 2001, vol. 37, No. 12, pp. 737-738.

Tsividis, "Continuous-time digital signal processing," Electronics Letters, 2003, vol. 39, No. 21, 2 pages.

Zhao, et al., "Continuous-Time Digital Signal Processing Based Controller for High-Frequency DC-DC Converters," Twenty Second Annual IEEE Applied Power Electronics Conference, 2007, pp. 882-886.

* cited by examiner

LOW DISTORTION SWITCHED-CAPACITOR EVENT-DRIVEN ANALOG TO DIGITAL CONVERTER

CROSS REFERENCE TO RELATED APPLICATION

The present application claims priority to earlier U.S. application Ser. No. 61/540,569 filed on Sep. 29, 2011, the content of which earlier application is incorporated by reference in its entirety in the present application.

FIELD OF THE INVENTION

The present invention concerns an event-driven tracking analog to digital converter (ADC) architecture. The proposed architecture has less sensitivity to amplifier and DAC non-linearity, reduces the swing and dynamic common-mode range requirement of the operational transconductance amplifier (OTA) and comparators, respectively. The efficiency of the ADC is confirmed by detailed circuit simulations.

BACKGROUND OF THE INVENTION AND PRIOR ART

Emerging ultra low-power applications such as wireless sensor networks and wireless body area networks require the integration of very efficient signal processing techniques, specifically in analog-to-digital conversion. General-purpose ADCs which rely on Nyquist theory result in unnecessary sampling, and dissipate excessive power within the ADC and subsequent digital signal processing units during periods of low activity.

Activity dependent (see Schell, B., Tsividis, Y.: 'A continuous-time ADC/DSP/DAC system with no clock and with activity-dependent power dissipation', *IEEE J. Solid-State Circuits*, 2008, 43, (11), pp. 2472-2481) (hereinafter "Reference [1]"), variable resolution (see Kurchuk, M., Tsividis, Y.: 'Signal-Dependent Variable-Resolution Clockless A/D Conversion with Application to Continuous-Time Digital Signal Processing', *IEEE Transactions on circuits and systems I*, 2010, 57, (5), pp. 982-991) (hereinafter "Reference [2]"), ADCs, and continuous time digital signal processing (see Tsividis, Y.: 'Continuous-time digital signal processing', *Electron. Lett.*, 2003, 39, (21), pp. 1551-1552 (hereinafter "Reference [3]") are the most recent techniques to tackle the aforementioned issues.

Prior art includes the following publications: WO 2011/046928, US 2004/263375, WO 2005/004373, WO 2006/063192, EP 2298164, WO 2006/039510, U.S. Pat. No. 7,839,317, US 2008/252280, US 2010/270989, WO 2007/036922, US 2007/216466.

PRINCIPLE OF THE INVENTION

The present application describes an event-driven ADC architecture which enables a significant relaxation of the analog circuit specifications and improvement of the performance of said circuit with respect to prior art known devices.

In an embodiment, the invention concerns as event-driven analogic-digital converter wherein said converter comprises at least
 a driver amplifier,
 comparators,
 an analog up and down counter,
 an integrator, and
 a Gray-code counter for providing a continuous-in-time and discrete-in-amplitude output,
wherein the output of the driver amplifier is applied to the + and − inputs of said comparators, the outputs of which are applied to the input of said said analog counter and said integrator;
wherein the input signal $V_i$ of the driver amplifier undergoes a substraction from a feedback signal which is the output of said analog counter and said integrator such that the LNA processes the tracking error.

In an embodiment the driver amplifier is a low-noise driver amplifier.

In an embodiment the integrator, the analog up and down counter and the driver-amplifier are implemented using a single OTA.

In an embodiment the integrator is a single bit SC integrator.

In an embodiment, the invention concerns a hearing aid comprising at least an external station to capture an input signal, said signal being amplified using a low-noise amplifier and transmitted through a narrow-band power amplifier which drives a link, wherein the aid further comprises an implanted part with a detector that demodulates the received signal and extracts the analog baseband signal which is fed into a converter as defined herein, a bank of asynchronous bandpass filters to extract the frequency components of the input signal and a set of stimulation electrodes driven by said extracted signal such that the dynamic power consumption of the filter bank is proportional to the input signal activity.

In an embodiment of the hearing aid the signal is captured by a microphone (31).

In an embodiment of the hearing aid said link is a wireless link.

In an embodiment, the invention concerns a DC-DC converter comprising at least switches, an L-C filter, a load, a converter as defined herein, a digital controller and a pulse width modulation system, wherein the switches inject or sink current into or from the output load through the L-C filter, wherein the expected voltage at the load is sensed by a feedback network which in turn activates to control the output voltage to its expected value, wherein the feedback network comprises said converter, said digital controller and said pulse width modulation system, so that one ADC conversion is performed and its result is passed over to said digital controller that controls said pulse width modulation system to generate non-overlapping signals in order to control said switches.

DETAILED DESCRIPTION OF THE FIGURES AND OF THE INVENTION

Figure 2:
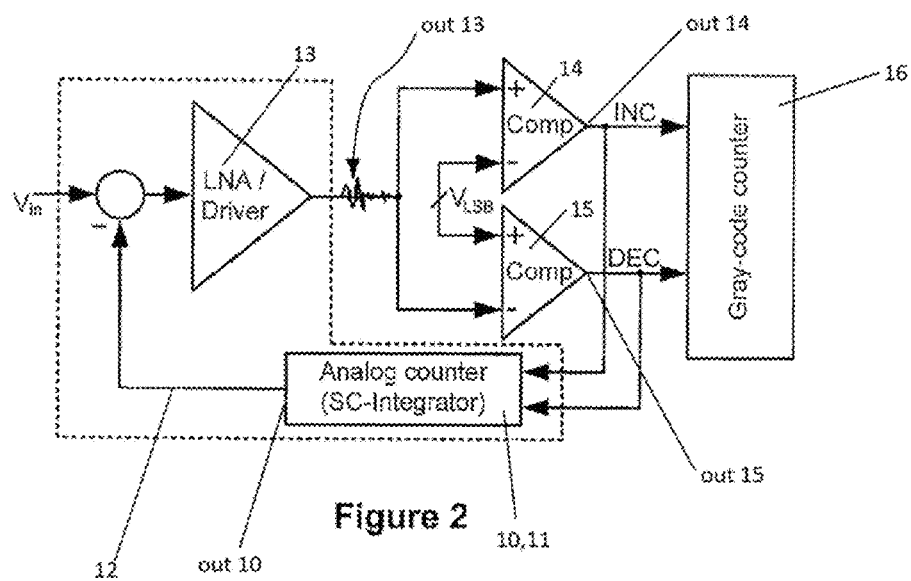
Figure 3:
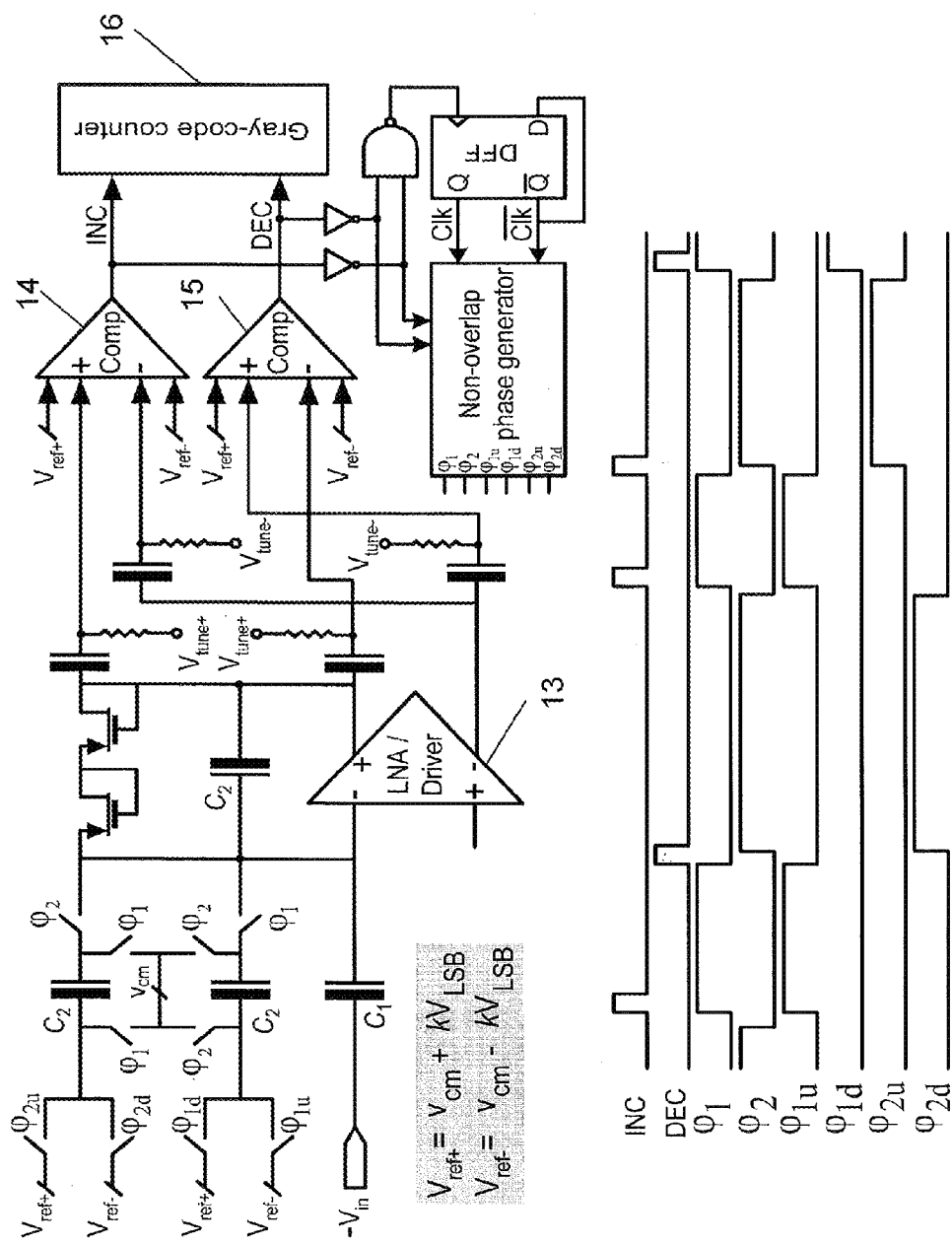
Figure 4:
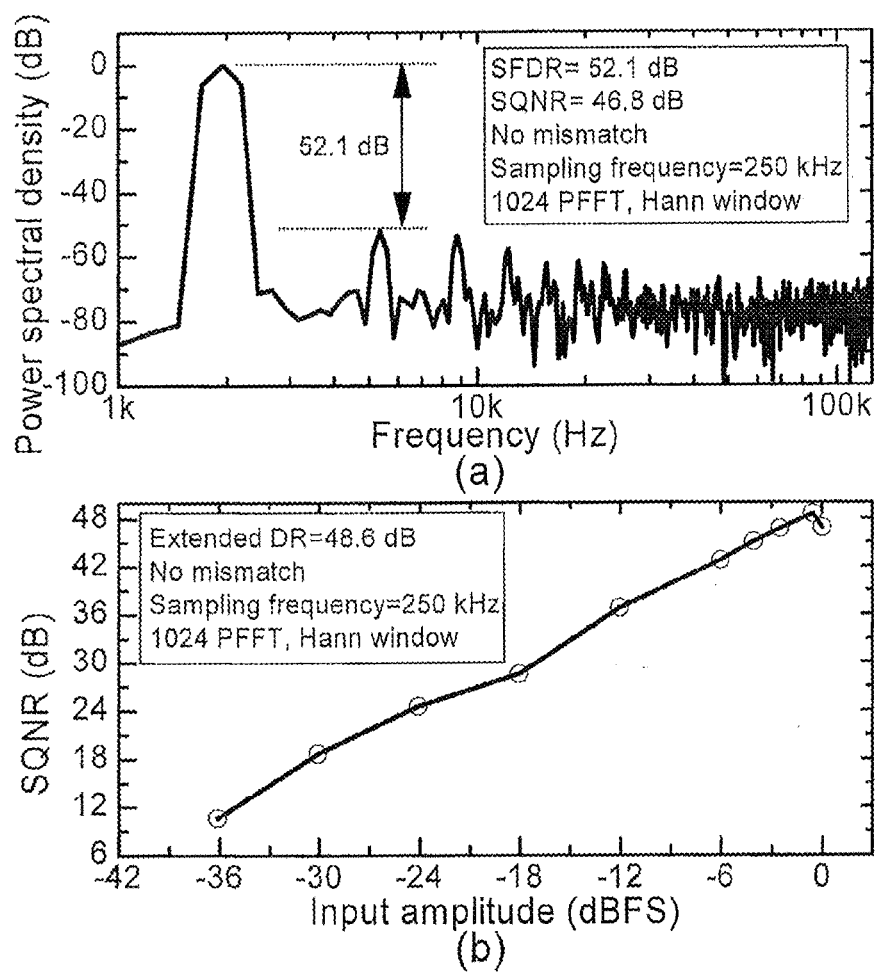
Figure 7:
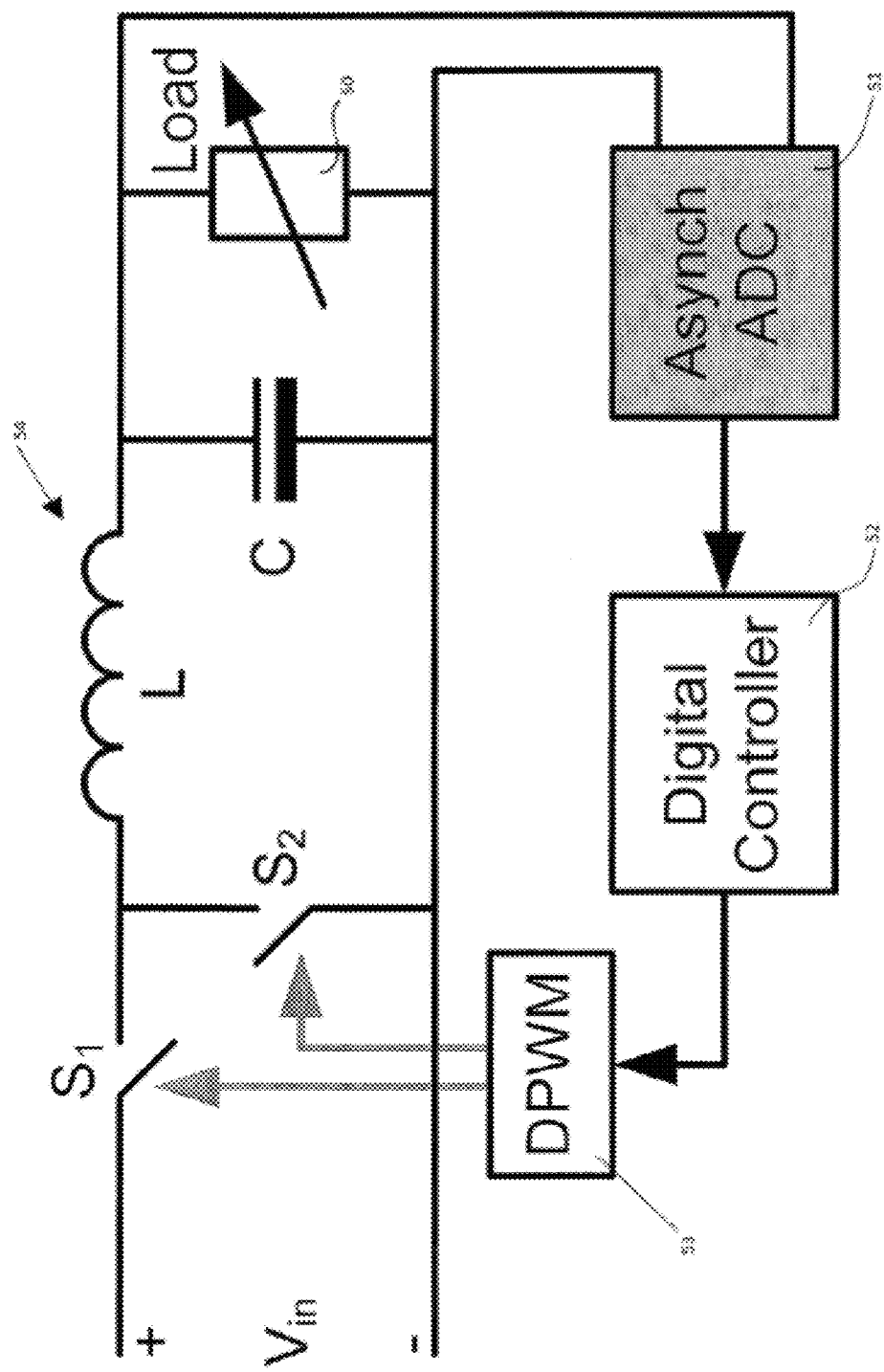

FIG. 1 illustrates a conventional event-driven converter;
FIG. 2 illustrates an event-driven converter according to the invention;
FIG. 3 illustrates a circuit implementation and corresponding timing diagram of the proposed architecture;
FIG. 4 illustrates an output spectrum of the ADC (a), DR of the ADC (b), after synchronous sampling;
FIG. 5 illustrates (a) Proposed self-reset dynamic voltage comparator, (b) conventional differential dynamic comparator used as core of comparison, (c) timing diagram of self-oscillation behavior, and (d) timing diagram of the output of the SR latch drive by input signal
FIG. 6 illustrates the architecture of a proposed cochlear implantable system as a possible application;

FIG. 7 illustrates the architecture of a DC-DC converter as a possible application.

EVENT-DRIVEN CONVERTERS KNOWN IN THE ART (CONVENTIONAL)

The architecture of a conventional event-driven converter is shown in FIG. 1 (see Reference [1]).

The input signal $V_{in}$ is scaled-up through a low-noise driver amplifier LNA/Driver 1 to the ADC input dynamic range, and is compared with discrete outputs 2, 3 of the resistor string DAC (RSDAC) 4 in comparators 5, 6. At each level-crossing event, the output of the RSDAC 4 is increased or decreased by a voltage step of $V_{LSB}$ equivalent to one least significant bit (LSB) of the ADC, always keeping the input signal within a voltage interval defined by the RSDAC outputs 2, 3 $V_{up}$ and $V_{down}$ and which has a magnitude equal to one $V_{LSB}$.

Thus, the tracking accuracy is defined by the RSDAC 4 resolution. Since sampling is not employed in the conversion process, the architecture is very robust to out-of-band interferers which mitigates the need for an aggressive anti-aliasing filtering, and helps to reduce the system total power consumption. However, the circuit implementation of this architecture suffers from several drawbacks.

Since the input signal is processed by the low-noise driver amplifier LNA 1, a linear and large output swing LNA is required, which is not straightforward to design in low-voltage regimes.

Moreover, rail-to-rail input-stage comparators 5, 6 are necessary to handle the large amplitude signals (large common-mode variation) at the comparator inputs.

Finally, the architecture is susceptible to the mismatch of the unit elements of the RSDAC 4, which may cause in-band harmonic distortion.

Low-Distortion Event-Driven Converter According to the Invention

An aim of the present invention is therefore to improve the known converters.

The proposed architecture according to the invention is depicted in FIG. 2.

In an embodiment, the digital controller 7 and RSDAC 4 of FIG. 1 are replaced with an up/down analog counter 10, a switched-capacitor (SC) integrator 11, and the feedback signal 12 is referred to the input of the LNA 13.

Thus, the LNA 13 processes the tracking error, i.e. quantization noise, instead of the input signal.

Consequently, the signal swing at the output of the LNA is dramatically reduced and is limited to one $V_{LSB}$ in a single-ended design, relaxing the linearity requirement of the LNA 13 (see Silva, J., Moon, U., Steensgaard, J., and Temes, G. C.: Wideband lowdistortion delta-sigma ADC topology, *Electron. Lett.*, 2001, 37, (12), pp. 737-738) (hereinafter "Reference [4]"). Moreover, the slew-rate requirement of the LNA 13 is considerably mitigated due to the reduced voltage swing.

The integrator 11, subtractor 10, and LNA 13 enclosed in the dashed box are implemented using a single OTA (Operational transconductance amplifier), i.e., without any additional active element.

Since subtraction is performed at the input 12 of the LNA 13 instead of the inputs of the comparators 14, 15, the comparison is conducted with respect to fixed reference voltages, i.e. not with respect to the dynamic outputs 2, 3 of the RSDAC 4. Removing the dynamic common-mode voltage at the input of the comparators 14, 15, rail-to-rail input-stage comparators (as the comparators 5, 6 of FIG. 1) are not required, which helps reducing the power consumption. The non-linearity issue of the multi-bit RSDAC is resolved by using a single-bit SC integrator 11 which is controlled by clock phases generated by comparators output ($out_{14}$ and $out_{15}$) increment (INC) and decrement (DEC) signals.

A continuous-in-time and discrete-in-amplitude output is obtained using an asynchronous Gray-code up/down counter 16, which also minimizes any potential error in consecutive synchronous sampling for spectral analysis purposes.

Example of Circuit Implementation

A circuit implementation of the proposed architecture and its corresponding timing diagram covering several consecutive crossing events is shown in FIG. 3.

A fully differential realization is employed, but a single-ended view is shown for the sake of simplicity. The continuous-time signal path formed by $C_1$ and $C_2$ provides additional gain for the input signal. The subthreshold diode-connected transistors in the feedback path provide the input common-mode voltage of the LNA 13, in long periods of signal inactivity. The integrator 10 is realized by the means of two time-interleaved capacitors $C_2$, which are controlled by non-overlapping phases of $\phi_1$ and $\phi_2$ as a way to relax the bandwidth requirement of the LNA, and at the cost of a negligible penalty related to the mismatch between two capacitors. It can be shown that the residue of the error at the LNA 13 output which is due to the mismatch of the two capacitors C2 integrates to zero for two consecutive INC or DEC crossing events, and is bounded to a maximum of one $V_{LSB}$ for consecutive INC and DEC events which occurs at zero input signal. The resolution of the ADC is adjusted by tuning parameter k or $V_{LSB}$. Differential comparators detect the crossing events. The DEC and INC signals are generated using the same differential reference voltages as in the integrator. Comparators offsets are cancelled by isolated DC operating points provided by high-pass filtering in front of the comparators, see Reference [1]. At each crossing event, the DFF generates an integration phase which is valid until the next crossing event in order to utilize the entire timing slot between two consecutive events for linear settling of the integrator.

A conventional non-overlapping phase generator 17 is used to generate non-overlapping integration phases $\phi_1$ and $\phi_2$ and the corresponding up/down integration phases $\phi_{1u,d}$ and $\phi_{2u,d}$, respectively.

Simulation Results

The proposed structure is simulated using a 0.18 μm CMOS technology with a 1.8 V supply voltage. The ADC can handle a full-scale of 1 $V_{p-p}$ (0 dBFS) single-tone input signal up to a frequency of 1.8 kHz without slope overloading and a total static current consumption of 6.8 μA. The higher input frequencies are processed with smaller amplitudes, e.g. −6 dBFS at 3.9 kHz. The output spectrum and dynamic range (DR) plot of the 8-bit ADC using an OTA with 31 dB of DC gain is shown in FIG. 4. Synchronous sampling at 250 kHz at the output of the Gray-code counter is used for spectral analysis purposes. The spurious free dynamic range (SFDR) with 0 dBFS input is simulated at 52.1 dB without considering any mismatch between the time-interleaved capacitors $C_2$, and slightly degrades to 50.4 dB by introducing the 3% of mismatch. The signal to quantization noise ratio (SQNR) integrated up to a frequency of 15.625 kHz is 46.8 dB and 45.8 dB without and with $C_2$ mismatch, respectively. The DR of the ADC is simulated at 48.6 dB. Better SQNR performance may be achieved by continuous-time filtering out of band components prior to synchronous sampling.

Other Embodiments

The main drawback of the proposed architecture of FIG. 3 is static power consumption of the continuous-time comparators, which are used to detect a crossing event. According to experiences in a proof of concept prototype 72% of total power consumption is contributed by two comparators. This power consumption is dictated by the small amount of propagation and regeneration delay that is required in the feedback loop and the comparator in order to track the dynamics of the input signal, and the short circuit current of the digital buffers at the output of the comparator, due to slow transition time. Consequently, a strong trade-off between power and speed exists in the proposed architecture.

The static power consumption of the comparator may be reduced using a predictive comparator technique which needs additional active circuitry and power dissipation.

A technique which is referred to as self-resetting dynamic comparator is proposed in this application which dramatically reduces the power consumption.

Figure 5A:
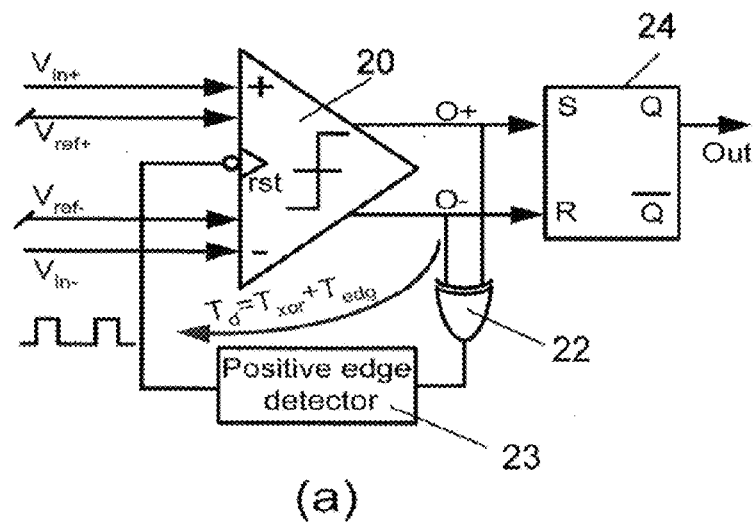
Figure 5B:
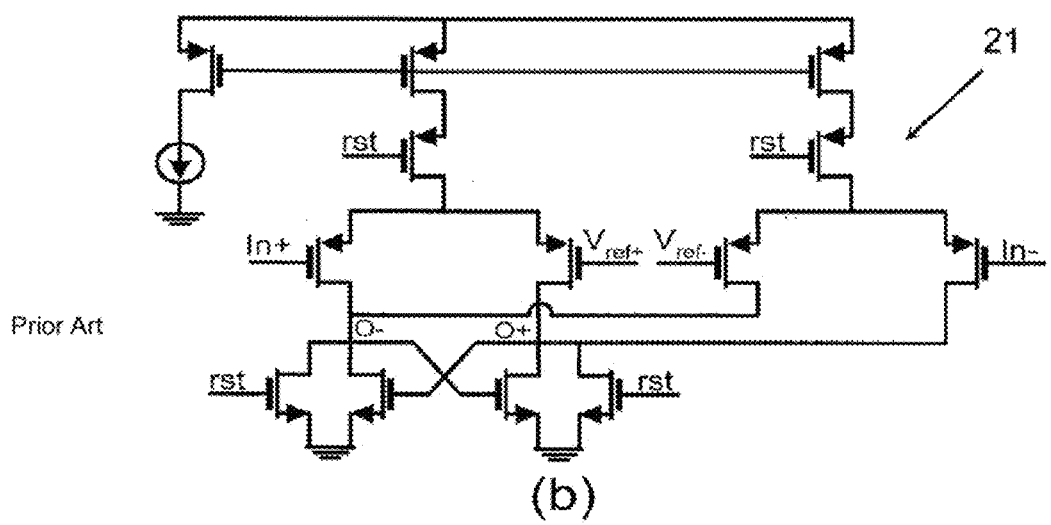
Figure 6:
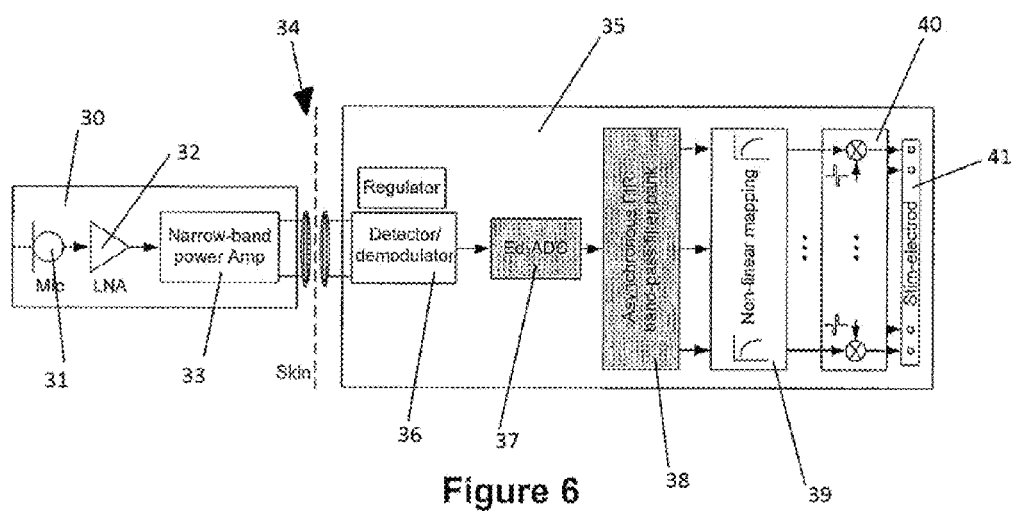

The proposed comparator 20 is shown in FIG. 5(a). A conventional differential dynamic comparator 21 (see FIG. 5(b)) is used for comparison purposes. However, the clock signal required for comparison and reset is not provided by an external signal source. The reset/clock signal is generated using the output of the comparator 20. When the reset signal is released (negative going edge of the rst), the output of the comparator is regenerated and due to the dynamic behavior of the comparator, the regeneration time is extremely fast. The completion of the regeneration is detected by an XOR Boolean gate 22 and the generated pulse is propagated through a positive edge detector circuit 23 with an associated delay of $T_d$. The generated pulse resets the comparator 20 and pulls down the reset signal again for another dynamic comparison.

Figure 5C:
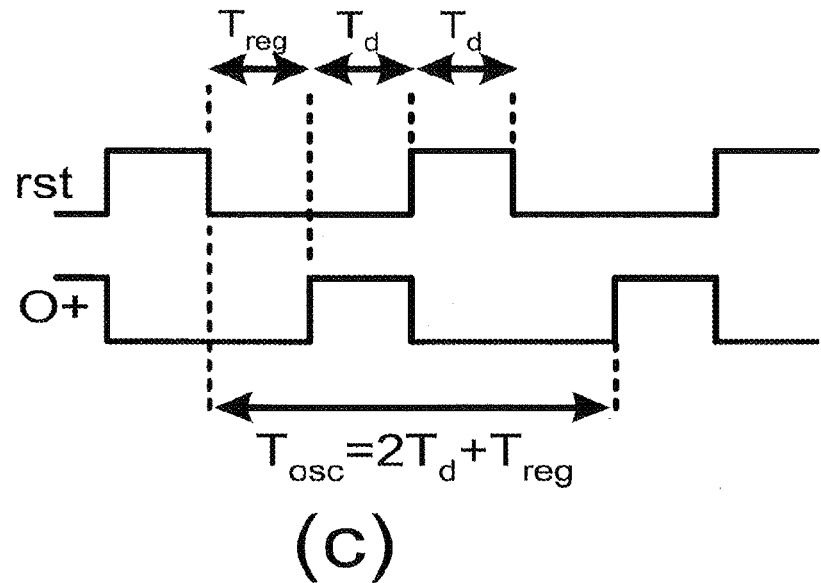

Consequently, the self oscillation behavior of the loop is used to drive the dynamic comparison. The timing resolution is defined by the delay of the self-oscillation loop and is equal to $T_{osc}=2T_d+T_{reg}$. Where $T_{reg}$ refers to the regeneration time of the comparator and $T_d$ is the delay provided by the XOR gate 22 and positive edge detector circuitry 23. The timing diagram of the oscillation behavior is shown in FIG. 5(c).

For a specific application the delay time, $T_{osc}$ can be tuned to track a specific input signal without slope overloading noise. The uncertainty at the decision point (which translates to quantization noise of the ADC) is defined by the oscillation period. The smaller $T_{osc}$ is, the better resolution is achieved at the cost of increased power consumption, due to larger dynamic power consumption of the logic. Simulation results show that for an identical input signal (aimed to capture audio signal) 50 times reduction in power consumption is achieved by using the proposed self-reset dynamic comparator. In high-resolution applications, the harmonic distortion of the ADC due to uncertainty imposed by $T_{osc}$ is mitigated by modulating the delay of the Td using a pseudo-random number generator.

Figure 5D:
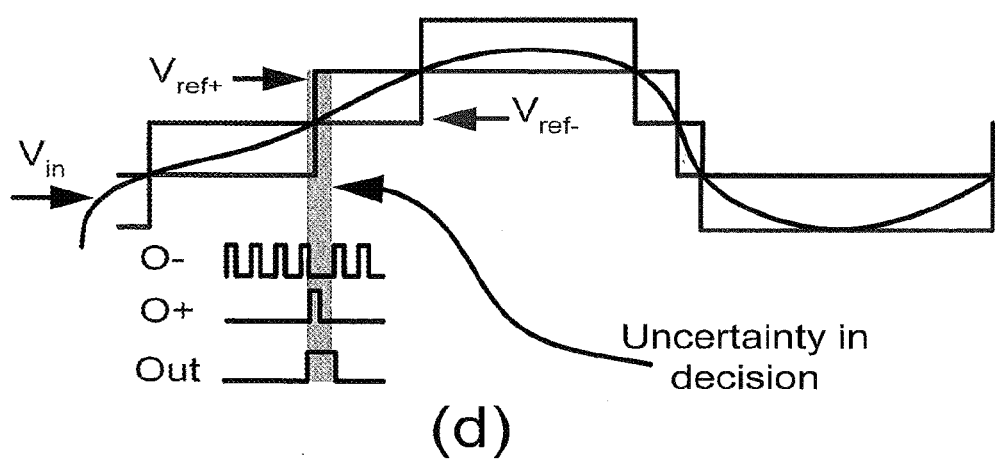

The output of the comparator is fed to an SR latch 24 in order to absorb the oscillation of the comparator's outputs, which is shown in FIG. 5(d). When the comparators output is reset to zero, the SR latch 24 preserves the previous state. Therefore, the output of the SR latch 24 is a pseudo-asynchronous stream which is driven by the activity of the input signal and retimed by oscillation edges. The output of the SR latch 24 is fed to an UP/DO Gray code counter (16, see FIGS. 2 and 3) and an asynchronous switched-capacitor circuit which is used to track the input signal.

Applications

Two proposed applications have been shown to have a very high market potential in the biomedical device and semiconductor industries.

1. Hearing Aid, and Cochlear Implantable Systems (FIG. 6)

In hearing aids, e.g. cochlear implants, as illustrated schematically in FIG. 6, the input signal is sparse in the time domain. The activity of the input signal considerably varies within various periods of time. Typically, the signal activity is very low at night. Even during day time, no activity needs to be processed most of the time. Finally, a speech signal has an intrinsic low activity.

The proposed architecture comprises an external station 30 which captures the input signal by the means of a microphone 31. The signal is subsequently amplified using a low-noise amplifier 32 and wirelessly transmitted through a narrow-band power amplifier 33 which drives the wireless link 34. The original scheme reduces the signal bandwidth which is required in the wireless link, only using analog baseband signal for modulation.

Power is also transmitted through the wireless link to the implant.

In the implanted part 35, the detector 36 demodulates the received signal and extracts the analog baseband signal which is fed into the proposed event-driven ADC 37. The frequency components of the input signal are extracted making use of a bank of asynchronous bandpass filters 38 which in turn drive 40 the individual electrodes 41 after non-linear mapping 39. Thanks to the use of the event-driven ADC 37, the dynamic power consumption of the filter bank 38 becomes proportional to the input signal activity.

The architecture of the hearing aid electronics; the reduction of the power consumption and bandwidth requirement in the wireless link which results in longer battery life, which are a benefit of the architecture; in the implant, the architecture is almost fully digital, which is novel in comparison to existing architectures, and comes as a direct benefits of the event-driven ADC 37.

2. DC-DC Converters (FIG. 7)

The proposed event-driven ADC can be used in the feedback control loop of DC-DC converters as schematically illustrated in FIG. 7, where it provides immediate equivalent code to the digital controller based on crossing events, (see Z. Zhao, V. Smolyakov, A. Prodic, Continuous-time digital signal processing based controller for high-frequency DC-DC converters, Proc. IEEE Applied Power Electronics Conf., Anaheim, Calif., 2007) (hereinafter Reference [5]).

The DC-DC converter is based on a closed loop system operation that enables the generation of an output voltage at the load 50 that is different from the input voltage ($V_{in}$) that generally originates from the supply, or integrated circuit supply.

The switches S1 and S2 are the core of the system, which inject or sink current into or from the output load, through the L-C filter 54. The expected voltage at the load is sensed by the feedback network, which in turn activates S1 and S2 to control the output voltage to its expected value and keep it stable and free of ripples, as much as possible.

In a classical architecture, the feedback network could comprise analog components and operate in continuous time; alternatively, it could comprise an ADC (analog to digital converter) which digitizes the voltage at the load. The digitized value of load voltage is compared to a digital reference; the result is further used to control the switches. In a classical digital feedback architecture, the ADC conversion operation and the further processing are clocked.

In such case, a conversion and a control process occurs at each clock cycle; specifically, this also occurs in cases where no control action is needed thanks to a stable voltage at the load.

The proposed event-driven ADC 51 in this embodiment has no clock, and its conversion operation is only dictated by the fact that the voltage at the load 50 exceeds a determined variation from its expected value.

In such case, one ADC conversion is performed; its result is passed over to a digital controller 52 that controls a pulse width modulation system 53 that generates the non-overlapping signals that control S1 and S2.

Power saving in this embodiment results from the fact that ADC operation is not triggered by a clock in a repetitive way, but results from crossing events at the input of the event-driven ADC that by construction only occur when a feedback control of the load voltage is needed.

The above examples and embodiments illustrate the operation and the features of the converter of the invention and of its exemplary applications and those of ordinary skill in the art will appreciate that embodiments of the present disclosure are not so limited as the examples/values/elements given above are only for illustrative purposes and should not be construed in a limiting manner. Different embodiments of the invention may be combined together according to circumstances. In addition, other embodiments and applications may be envisaged within the spirit and scope of the present invention, for example by using equivalent means.

The invention claimed is:

1. An event-driven analog-digital converter comprising:
   a driver amplifier;
   comparators;
   an analog up and down counter;
   an integrator; and
   a Gray-code counter for providing a continuous-in-time and discrete-in-amplitude output,
      wherein the output of the driver amplifier is applied to the positive and negative inputs of said comparators, the outputs of the comparators are applied to the input of said analog counter and said integrator,
      wherein the input signal of the driver amplifier undergoes a subtraction from a feedback signal which is the output of said analog counter and said integrator such that the driver amplifier processes the tracking error.

2. The converter as defined in claim 1 wherein said driver amplifier is a low-noise driver amplifier.

3. The converter as defined in claim 1, wherein said integrator, said analog up and down counter and said driver-amplifier are implemented using a single OTA (operational transconductance amplifier).

4. The converter as defined in claim 1, wherein the integrator is a single bit SC (switched capacitor) integrator.

5. The event-driven analog-digital converter of claim 1 electrically coupled to a hearing aid, the hearing aid comprising:
   an external station to capture an input signal, said signal being amplified using a low-noise amplifier and transmitted through a narrow-band power amplifier which drives a link, wherein the hearing aid further comprises an implanted part with a detector that demodulates the received signal and extracts the analog baseband signal which is fed into the event-driven analog-digital converter, a bank of asynchronous bandpass filters to extract the frequency components of the input signal and a set of stimulation electrodes driven by said extracted signal such that the dynamic power consumption of the filter bank is proportional to the input signal activity.

6. The hearing aid as defined in claim 5, wherein the signal is captured by a microphone.

7. The hearing aid as defined in claim 5, wherein said link is a wireless link.

8. The event-driven analog-digital converter of claim 1 electrically coupled to a DC-DC converter, the DC-DC converter comprising:
   switches;
   an L-C filter;
   a load;
   a digital controller and
   a pulse width modulation system, wherein the switches inject or sink current into or from the output load through the L-C filter, wherein the expected voltage at the load is sensed by a feedback network which in turn activates the switches to control the output voltage to its expected value, wherein the feedback network comprises said event-driven analog-digital converter, said digital controller and said pulse width modulation system, so that one ADC conversion is performed and its result is passed over to said digital controller that controls said pulse width modulation system to generate non-overlapping signals in order to control said switches.

* * * * *